INVENTORS
BERNARD M. GORDON
ZAKI ABDUN-NABI
BY
Robert J. Schiller
ATTORNEY

INVENTORS
BERNARD M. GORDON
ZAKI ABDUN-NABI
BY Robert J. Schiller
ATTORNEY

DIGITAL COUNTER

Filed Aug. 11, 1964

3 Sheets-Sheet 3

INVENTORS
BERNARD M. GORDON
ZAKI ABDUN-NABI
BY
Robert J. Schiller
ATTORNEY

United States Patent Office 3,349,228

Patented Oct. 24, 1967

3,349,228

DIGITAL COUNTER

Bernard M. Gordon, Magnolia, and Zaki Abdun-Nabi, Framingham, Mass., assignors, by mesne assignments, to Janus Control Corporation, Waltham, Mass., a corporation of Massachusetts Filed Aug. 11, 1964, Ser. No. 388,761

6 Claims. (Cl. 235—92)

ABSTRACT OF THE DISCLOSURE

A binary counter having cascaded transistor flip-flops each of which has a pair of tied together trigger input terminals respectively coupled through a capacitor to a diode connected to a corresponding transistor base, each flip-flop having a resistance gated diode type steering circuit, the output of a flip-flop at a later stage in the cascade providing a source of blocking voltage, and a conductive feed back path for that blocking voltage to an earlier stage to one common junction of a steering resistor and its associated diode and coupling capacitor so as to inhibit the operation of that earlier stage when the blocking voltage is present.

This invention relates to digital electronic devices, and more particularly to binary-coded decimal counters.

A number of digital devices for performing a binary count of from 0 to 9 of signals such as pulses, and providing output signals in decimal form, are known and termed binary-coded decimal (BCD) Counters. Each decade of such a counter is usually formed of four cascaded bistable stages. A number of schemes are used for forcing the counter to return to a decimal zero output upon a 9th count when counting from zero. Typically, the output of the fourth stage is fed to back to inhibit the operation of the second stage and an output of the first stage is fed forward to trigger the fourth stage so that the 9th count results in the counter output returning to zero. Inhibition is generally accomplished through the use of gates, such as diodes. The output signals indicative of the state of each bistable stage of the decade are converted in a decoding matrix for driving a decimal display device.

A principal object of the present invention is to provide a novel binary-coded decimal counter which is relatively simple and inexpensive to manufacture.

Other objects of the present invention are to provide, in a binary-coded counter employing a number of cascaded bistable stages with at least one feedback loop from the output of a later stage to the input of an earlier stage for inhibiting a change of state of the earlier stage, novel means for blocking or inhibiting that earlier stage; to provide in such a counter having as bistable stages, flip-flops, each flip-flop including a pair of regeneratively cross-coupled inverters and a pair of trigger input terminals each respectively coupled to a control terminal of an inverter through a capacitive element, means for inhibiting a change of state of said inverters by applying a blocking voltage to the side of one capacitive element connected to the control terminal so as to prevent passage of a triggering signal through said element and thus hold the associated inverter in a fixed state.

Yet other objects of the present invention are to provide, in a BCD counter having a biquinary numerical indicator read-out display, a novel binary-to-biquinary decimal converter; to provide such a converter wherein is included a novel decoding matrix; and to provide in such a counter wherein the display is a cold cathode gas-filled indicator tube, novel means for switching the high voltages required to excite the plates of said tube.

Other objects of the invention will in part be obvious and will in part appear hereinafter. The invention accordingly comprises the apparatus possessing the construction, combination of elements, and arrangement of parts which are exemplified in the following detailed disclosure, and the scope of the application of which will be indicated in the claims. For a fuller understanding of the nature and objects of the present invention, reference should be had to the following detailed description taken in connection with the accompanying drawing wherein:

Figure 1:
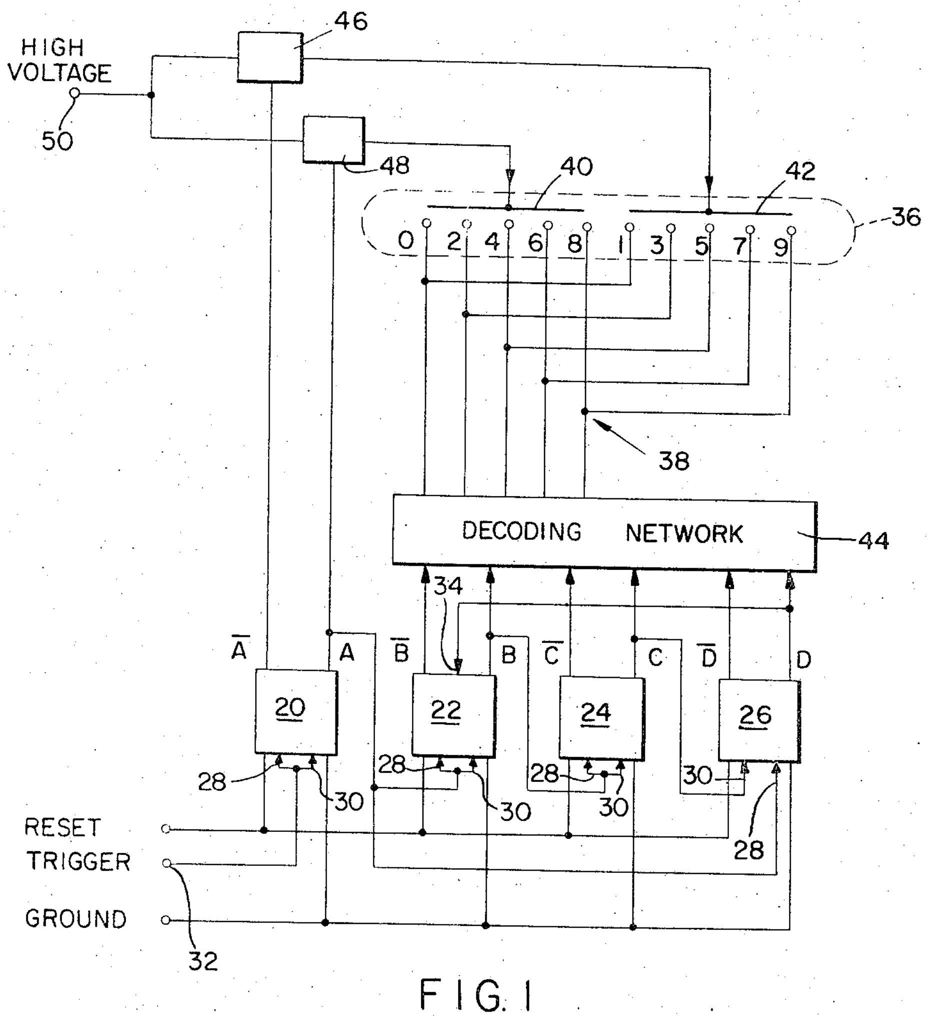
FIG. 1 is a schematic block diagram of an embodiment of the present invention.

Referring now to FIG. 1, there is shown a block diagram of a counter of the present invention, which for simplicity in exposition, is presented as but a single decade combining four bistable devices 20, 22, 24, and 26. Each of the latter characteristically is capable as assuming one of two stable states, and indicative thereof, each has a pair of output terminals at which mutually exclusive signals can appear. Thus, device 20 has an assertion terminal A and a negation terminal $\overline{A}$. Terminals for devices 22, 24, and 26 are similarly identified as B, $\overline{B}$; C, $\overline{C}$; and D and $\overline{D}$. Each bistable device includes a pair of signal input terminals 28 and 30. The bistable devices are cascaded in that the assertion output terminal of each bistable device (except the last) is connected to at least one of input terminals 28 and 30 of the next adjacent device in line. Specifically, devices 20, 22, and 24 have their input terminals 28 and 30 tied together. Terminals 28 and 30 of device 20 are connected to input trigger terminal 32 of the counter. Output terminal A is connected to coupled terminals 28 and 30 of device 22. Output terminal B of device 22 is connected to coupled terminals 28 and 30 of device 24. Output terminal C of device 24 is connected to only input terminal 30 of device 26. A feed-forward path is provided by a connection between output terminal A and terminal 28 of device 26, and a feed-back path is provided by a connection between output terminal D and inhibit terminal 34 of device 22. The usual reset and ground connections are also provided.

The counting decade thus described operates in known manner as follows:

Assuming that at count zero at terminal 32 the following output terminals are positively charged (i.e. "enabled"), $\overline{A}$, $\overline{B}$, $\overline{C}$, and $\overline{D}$, then terminals A, B, C, and D can be assumed to be negatively charged, neutral or of lesser positive charge (i.e. "disabled"). When the first signal to be counted is applied to the input terminals of device 20, as is well known, it will change the state of the latter so that terminal A is now disabled and terminal $\overline{A}$ is enabled. If one assumes that the input signals at terminals 28 and 30 of any of the bistable devices can only change the state of the latter by a negative-going transition, then the change in the decade due to the first input (or count 0) is in the nature of the output of device 20. However, on the next input signal (or count 1) to terminal 32, device 20 reverts to its zero count state, but the negative-going change of the signal at output terminal A causes device 22 to change its state. Thus, the following table indicates the output terminals which are enabled responsively to counts 0 to 9:

TABLE

| Count | Enabled Terminals | | | |
|---|---|---|---|---|
| 0 | $\overline{A}$ | $\overline{B}$ | $\overline{C}$ | $\overline{D}$ |
| 1 | A | $\overline{B}$ | $\overline{C}$ | $\overline{D}$ |
| 2 | $\overline{A}$ | B | $\overline{C}$ | $\overline{D}$ |
| 3 | A | B | $\overline{C}$ | $\overline{D}$ |
| 4 | $\overline{A}$ | $\overline{B}$ | C | $\overline{D}$ |
| 5 | A | $\overline{B}$ | C | $\overline{D}$ |
| 6 | $\overline{A}$ | B | C | $\overline{D}$ |
| 7 | A | B | C | $\overline{D}$ |
| 8 | $\overline{A}$ | $\overline{B}$ | $\overline{C}$ | D |
| 9 | A | $\overline{B}$ | $\overline{C}$ | D |

It will be seen thath in order for the tenth count to return the counter to the zero state of $\overline{ABCD}$ (the equivalent of binary 0000) instead of $\overline{A}B\overline{C}D$ (the equivalent of binary 1010), it is necessary that the negative-going transient signal occurring as terminal A becomes disabled not effect the state of device 22, but that the state of device 26 be changed so that terminal D is disabled and terminal $\overline{D}$ is again enabled. The provision of the feed-forward loop is intended to effect the proper change of state of device 26, while the feedback loop is intended to provide the desired inhibition of the change of state of device 22.

As a display device for visual read-out of the code appearing on the output terminals of the decade, there is preferably employed biquinary numerical indicator tube 36 which typically comprises five pairs of cathodes indicated generally at 38, and two anodes 40 and 42.

Interposed between the cathodes of tube 36 and the output terminals of the counter decade is means, such as network 44, for selectively energizing unique cathode pairs according to a corresponding unique pair of binary numbers responsively to the output terminal energization of devices 22, 24, and 26. Switching means 46 and 48 are provided for respectively controlling the energization of anodes 40 and 42 in accordance with the parity of the decade as determined by the signals appearing at the output terminals of device 20. This is accomplished by alternatively, according to which one of terminals A or $\overline{A}$ is enabled, switching the connection between terminal 50 (adapted to be connected to a high-voltage source) and one of anodes 40 and 42.

Figure 2:
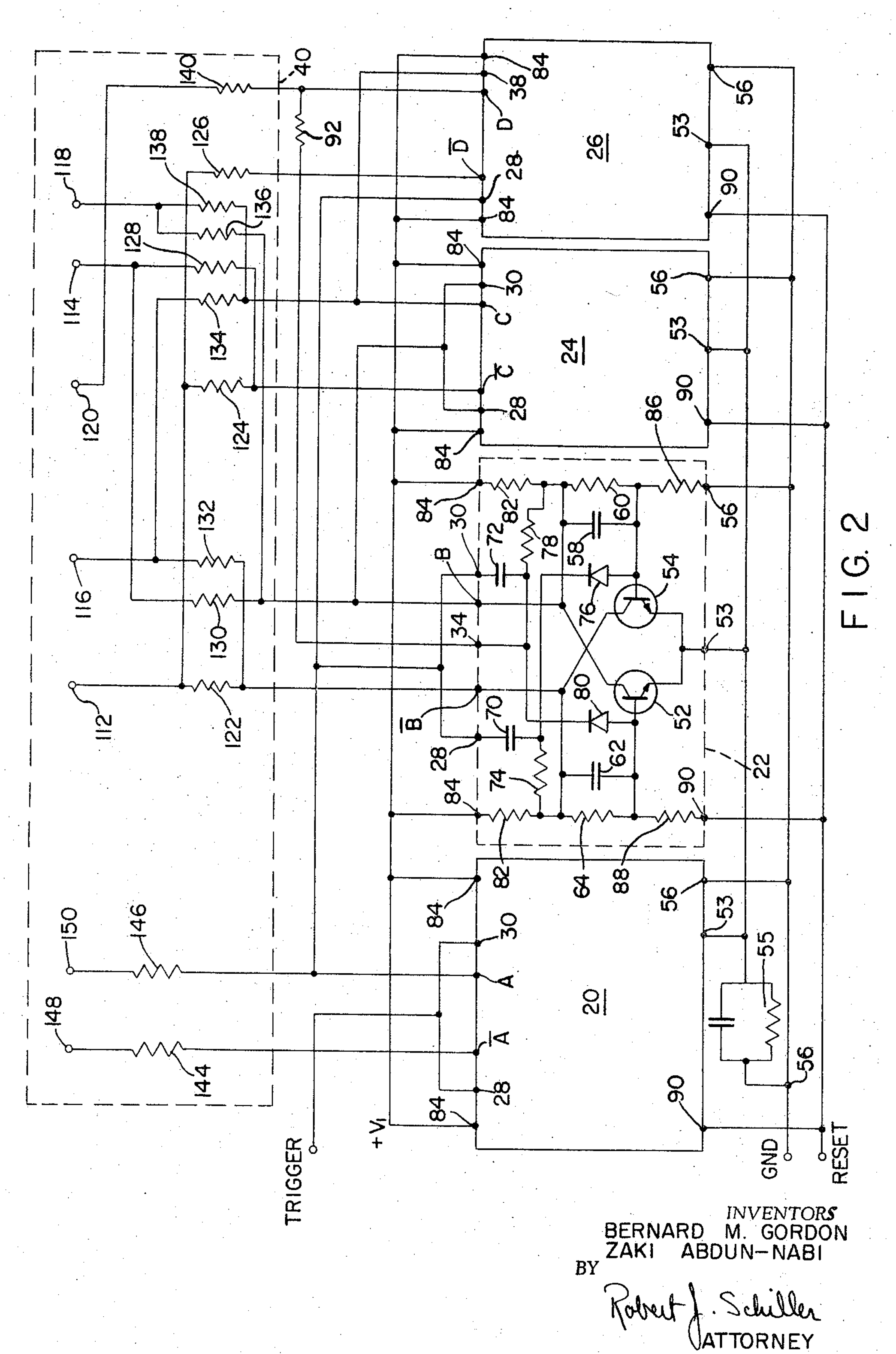
FIG. 2 is a diagram, partly in block form and partly in detailed circuit schematic, of a portion of the embodiment of FIG. 1.
Figure 3:
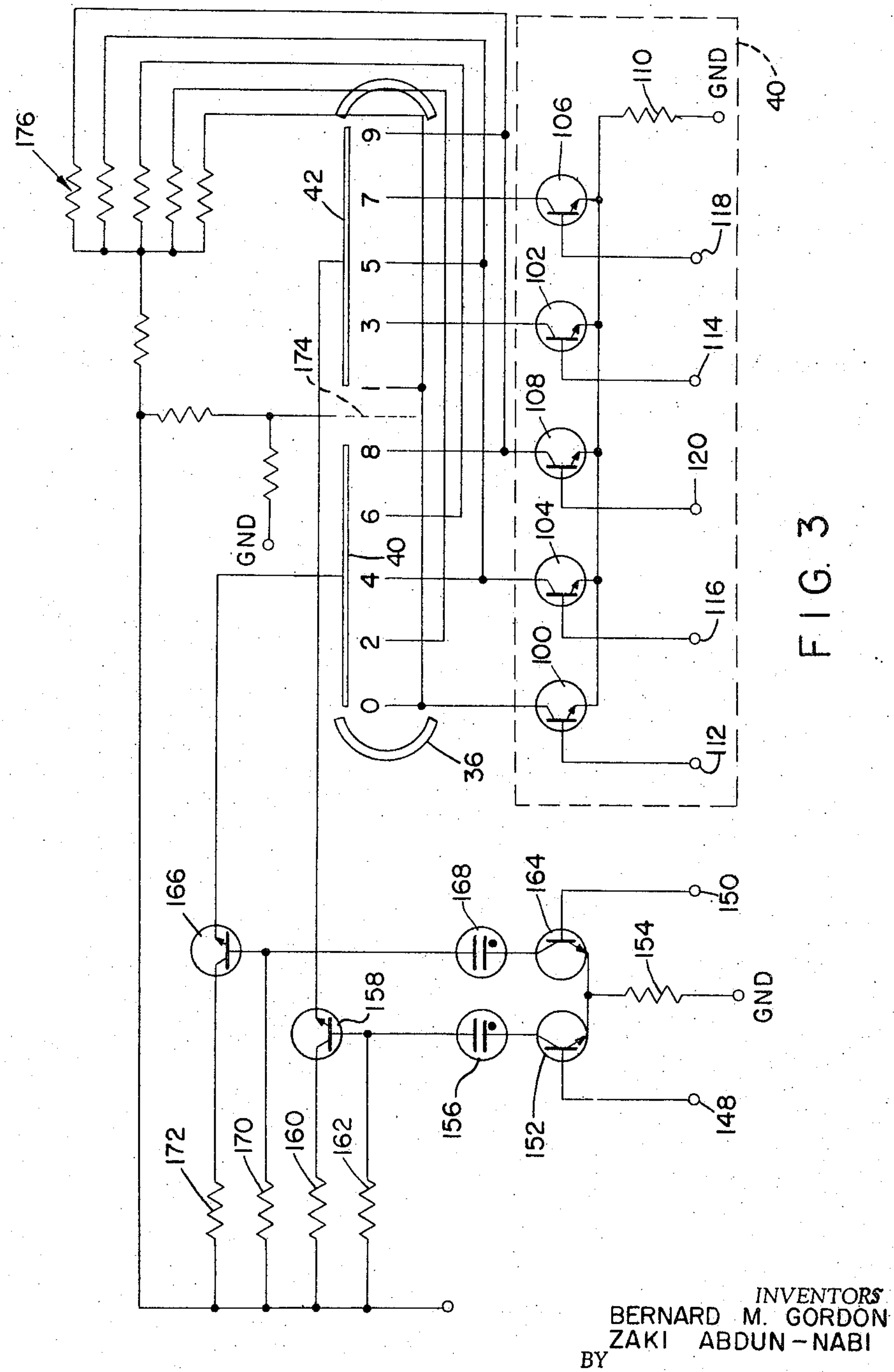
FIG. 3 is a schematic circuit diagram showing the details of yet another portion of the embodiment of FIG. 1.

Referring now to FIGS. 2 and 3 it will be seen that the bistable devices of FIG. 1 are illustrated in FIG. 2 together with part of decoding network 44, the remainder of the embodiment of FIG. 1 being detailed in FIG. 3.

Each bistable device in FIG. 2 is, in the form shown, a well-known bistable multivibrator or flip-flop, the detailed circuit whereof is shown only with respect to device 22. The latter typically comprises a pair of regeneratively cross-coupled inverters such as npn transistors 52 and 54. The latter are disposed to form a base-triggered flip-flop wherein the transistor emitters are connected directly to one another at terminal 53, and through a resistor and by-pass capacitor combination 55 to a common or ground terminal 56. The collector of transistor 52 is connected through parallel capacitor 58 and resistor 60 to the base of transistor 54. Similarly the collector of the latter is connected to the base of transistor 52 through parallel capacitor 62 and resistor 64. A pair of trigger input terminals, 28 and 30 are tied together externally to provide a single trigger input. Terminals 28 and 30 are respectively connected to one side of coupling capacitors 70 and 72.

To provide trigger steering, the collector of transistor 54 is connected through resistor 74 to the other side of capacitor 70, while the cathode and anode of diode 76 are respectively connected to that other side of capacitor and the base of transistor 54. Similarly, the other side of capacitor 72 is connected through resistor 78 to the collector of transistor 52 and also to the cathode of diode 80, the anode of the latter being connected to the base of transistor 52. Each collector is also connected through a respective one of resistors 82 to terminal 84 adapted to have a positive potential, $+V_1$, applied thereto. The base of transistor 54 is connected through resistor 86 to a ground terminal 56, the base of transistor 52 being likewise connected through transistor 88 to a reset terminal 90. The collectors of transistors 54 and 52 are respectively connected to output terminals $\overline{B}$ and B.

Assuming for example that $+V_1$ is 15 volts, and that a transient signal of positive polarity has been applied at reset terminals 90 of each flip-flop simultaneously, the signal will bring the base of each transistor 52 up, forcing their collectors to go negatively (for example to +6 volts from about +12). Due to the cross-coupling, the bases of the transistors 54 go down (i.e. negatively) and transistors 54 are all driven into nonconductive states in which their collectors are all at the +12 volt level. Thus, terminals $\overline{A}$, $\overline{B}$, $\overline{C}$, and $\overline{D}$ can be considered energized or enabled (i.e. at +12 volts) while terminals A, B, C, and D are all disabled (i.e. at +6 volts). This, of course, is the zero or reset state of the decade.

A negative-going signal now applied at either of terminals 28 and 30 (as may occur simultaneously to both terminals of flip-flops 20, 22, and 24, but not flip-flop 26) of flip-flop 20 will trigger the latter, turning its transistor 54 "on" and transistor 52 "off," thereby providing a +12 volt output at terminal A and dropping terminal A to +6 volts. The next trigger signal to flip-flop 20 causes terminal A to move toward +6 volts, and this negative-going transition then triggers the input terminals of flip-flop 22 causing the latter to change the state of its output so that terminal B is enabled and terminal $\overline{B}$ is disabled. The transient at terminal A is also connected to input terminal 28 flip-flop 26. However, it will be remembered that the $\overline{D}$ terminal of the latter is enabled; thus, the negative-going transient applied to the base of the transistor 54 of flip-flop 26 does not change the state of the latter.

As previously noted, after the eighth pulse (count 7 when counting from zero), the enabled terminals are A, B, C, and $\overline{D}$. The ninth pulse now changes the state of flip-flop 20 so that terminal $\overline{A}$ is enabled. The negative-going signal as terminal A becomes disabled changes flip-flop 22 so that terminal $\overline{B}$ becomes enabled and B becomes disabled. The latter change is in turn fed forward to flip-flop 24 so that its terminal C is disabled, this change is coupled to terminal 30 of flip-flop 26, driving the base of its "on" transistor 52 negatively and thereby enabling terminal D and disabling terminal $\overline{D}$. The negative transient fed forward from terminal A to input terminal 28 of flip-flop 26 will not hold the last flip-flop in its negation output state because of the steering provided.

As the collector of transistor 52 of flip-flop 26 rises to +12 volts (i.e. when terminal D becomes enabled) the 12 volt signal is fed back through resistor 92 to terminal 34 of flip-flop 22. Terminal 34 is connected to a point between the cathode of diode 80 and capacitor 72. By judicious choice of values of resistors 92 and 78 particularly, the magnitude of the voltage fed back to one side of capacitor 72 establishes and maintains a charge on that one side of capacitor 72 such that none of the voltage changes at terminal 30 due to input from flip-flop 20 can affect the base of transistor 52 enough to alter the conductive state of the transistor. Thus, the feedback prevents or inhibits the latter from turning "off." Because flip-flop 22 cannot change state, flip-flop 24 is also inhibited.

The next pulse changes flip-flop 20 so that its A terminal is enabled. The ninth pulse disables terminal A and enables the $\overline{A}$ terminal, thereby providing a negative-going signal. While the latter cannot affect flip-flop 22 (which is inhibited as described), it is fed forward to terminal 28 of flip-flop 26, and thus triggers the latter to turn its transistors 54 and 52 respectively "on" and "off." It will be seen that the pulse therefore changes the state of the "on" terminals from $A\overline{BC}D$ to $\overline{ABCD}$, a return of the decade to its zero count state.

As shown particularly in FIG. 3, tube 36 is preferably a cold cathode, gas filled, biquinary numerical indicator tube having five pairs of cathodes. Numerals from 0 to 9 are respectively associated with each one of the cathodes. A screen is disposed between the odd and even numbered cathodes. A typical tube of this type is available from Amperex Electronic Corporation of Long Island, N.Y. and has an anode current of 4 ma. requiring 200 volts DC supply. It will be seen that cathode pairs (each cathode being identified by the numeral it energizes) are arranged such that a numerically adjacent odd and even pair of cathodes are connected to one another. Thus, 0 and 1, 2 and 3, 4 and 5, 6 and 7, 8 and 9 are connected cathode pairs. These cathode pairs are respectively connected to the collectors of corresponding driving transistors 100, 102, 104, 106, and 108. All the emitters of the driving transistors are connected together and to ground through common resistor 110. The bases of transistors 100, 102, 104, 106, and 108 are respectively connected to terminal points 112, 114, 116, 118, and 120.

In order to insure that only one cathode pair can be driven at a time and thus avoid ambiguity, decoding network 40 (the transistor drivers of which are as described hereinbefore and are shown in FIG. 3) includes as a portion thereof, a resistive network or matrix as shown in FIG. 2. Referring to the preceding table, it will be seen that counts 0 and 1 are uniquely identified by the "on" condition of $\overline{B}$, $\overline{C}$, and $\overline{D}$. Thus, the latter terminals are connected to terminal 112 through respective resistors 122, 124, and 126, and therefore control the operation of transistor 100 for driving cathodes 0 to 1. In order for transistor 100 to conduct, it is necessary to impose a base bias of proper magnitude and polarity thereon. Terminal 112 will be at that necessary voltage if and only if all of terminals $\overline{B}$, $\overline{C}$, and $\overline{D}$ are energized. Typically, where $\overline{B}$, $\overline{C}$, and $\overline{D}$ when enabled are at +12 volts and are at +6 volts when disabled, resistors 122, 124, and 126 are about 9kΩ.

In the same manner, because counts 2 and 3 are uniquely represented by the enabled condition of $\overline{C}$ and B, the latter terminals are connected respectively through resistors 128 and 130 to terminal 114; the enabled condition of $\overline{B}$ and C uniquely represents counts 4 and 5, so these flip-flops terminals are respectively coupled to terminal 116 through resistors 132 and 134; terminals B and C, the enabled condition of which is unique to counts 6 and 7, are respectively connected through resistors 136 and 138 to terminal 118; and lastly, the enabled condition of terminal D alone being distinctive of counts 8 and 9, that terminal is connected, as through resistor 140, to terminal 120. Typically (again assuming +6 volts as disabled and +12 volts as enabled) resistors 128, 130, 132, 134, 136, and 138 can be about 6 kΩ and resistor 140 can be 3 kΩ.

The proper base current for a conducting driver transistor (i.e. one having all flip-flop terminals connected thereto "on") is assured by appropriate choice of those values for the resistors in the base circuit.

In order to selectively activate only one cathode of any given pair, the counter includes switching means 46 and 48 whereby either the anode adjacent the odd numbered cathodes or the anode adjacent the even numbered cathodes can be exclusively energized. To this end, with an indicator tube of the type illustrated, it is necessary to switch relatively high voltages such as the DC supply voltage $+V_2$ of 200 volts intended to be applied at terminal 50 as heretofore noted.

Thus, the resistive matrix of decoding network 40 as shown in FIG. 2, also includes a pair of resistors 144 and 146. Resistor 144 is disposed in series between terminal $\overline{A}$ of flip-flop 20 and terminal point 148. Resistor 146 is positioned in series between terminal A and terminal point 150. It will be remembered that terminals $\overline{A}$ and A are shown in FIG. 1 as respectively connected to switching means 46 and 48, as shown in detail in FIG. 3, switching means 46 comprises first transistor 152 having its base connected to terminal point 148 and its emitter connected to ground through resistor 154. The collector of transistor 152 is coupled through voltage dropping means such as gasfilled diode or neon glow-tube 156 to the base of second transistor 158. The emitter of the latter is connected to anode 42 of tube 36. The collector and base of transistor 158 are respectively connected to high voltage terminal 50 through resistors 160 and 162, the value of resistor 162 being greater than that of resistor 160 by a factor of at least 10. For example, transistor 158 can be a 2N1990 transistor and typical resistor values are as follows: resistors 144, 6 kΩ; resistor 160, 3 kΩ; and resistor 162 39 kΩ.

In like manner, switching means 48 is formed of a pair of transistors 164 and 166. The emitter, base and collector of transistor 164 are respectively connected to the emitter of transistor 152, terminal point 150, and through another glow-tube 168 to the base of transistor 166. The emitter of the latter is connected to anode 40. The base and collector of transistor 166 are respectively connected to terminal 50 through resistors 170 and 172, resistor 170 being at least 10 times greater in value than resistor 172.

In known manner, terminal 50 is also connected through a voltage divider to ground and to screen 174 in tube 36, and to a group 176 of parallel resistors each of which in turn is connected in series between terminal 50 and a pair of cathodes of tube 36.

As each successive unit pulse is applied at terminal 32 of the counter, flip-flop 20 alternates its state and terminals A and $\overline{A}$ alternately go negatively and positively oppositely to one another. When terminal $\overline{A}$ goes negatively toward +6 volts (and of course terminal A substantially simultaneously goes positively to +12 volts), transistor 152 becomes backbiased and turns "off." Although a resistor or solid-state diode for example could be used in place of tube 156 (inasmuch as the purpose of the glow-tube is to provide a large voltage drop between the collector of transistor 152 and the base of transistor 158), it is preferred to employ the glow-tube because of its low cost and the fact that the voltage across the tube during conduction is reasonably constant and independent of current over a fairly large current range.

When transistor 152 goes "off," the glow-tube deionizes and disconnects transistor 152 from the base of transistor 158. This permits the voltage at the base of the latter to rise toward the collector voltage, thus turning transistor 158 "on." During conduction, the base resistor 162 being so much greater than the magnitude of resistor 160, current flow is largely in the collector-emitter circuit of transistor 158. The output of transistor 158 serves to energize only anode 42 which is adjacent the odd-numbered cathodes and screened from the even-numbered cathodes. When anode 42 is energized anode 40 is not inasmuch as transistor 164 must be "on"; tube 168 is therefore in conduction, and the base of transistor 166 is so biased that transistor 166 is held "off." Now, for example, if the other "on" terminals of the decade are, $\overline{B}$, $\overline{C}$, and $\overline{D}$, then the latter, being all connected to terminal 112 through resistors 122, 124, and 126, have turned transistor 100 "on." Because only anode 42 is energized at that time, only the numeral 1 (which is the decimal indication of the binary state of the counter) will be displayed. A similar analysis extends to every state of the counter.

Since certain changes may be made in the above apparatus without departing from the scope of the invention herein involved it is intended that all matter contained in the above description or shown in the accompanying drawing shall be interpreted in an illustrative and not in a limiting sense.

What is claimed is:

1. In a binary counter having a cascaded plurality of flip-flop stages, each of said flip-flops including a pair of regeneratively cross-coupled inverters, a pair of trigger input terminals each coupled through a respective capacitor to a diode connected to a control terminal of a respective inverter said input terminals being tied together, and a pair of steering resistive impedances each connecting a junction of a corresponding said diode and said capacitor to the output terminal of the respective inverter, the improvement comprising means for inhibiting a change of state of one of said flip-flops and comprising a source of blocking DC voltage and means for applying said voltage to a point in the circuit of said one of said flip-flops at the junction of the corresponding one of said resistive impedances, said capacitors and its associated diode.

2. A binary counter as described in claim 1 wherein said source of blocking voltage is another flip-flop which is a later stage of the cascaded plurality, and said means for applying said voltage is a conductive feedback path from one output of said later stage.

3. A binary counter as defined in claim 2 wherein said one flip-flop is normally responsive to a signal transient going toward a predetermined polarity and applied at trigger input terminal of said one flip-flop so as to effect said change of state, and said blocking voltage is of an opposite polarity and of a magnitude greater than the transient change in said signal.

4. A binary counter as defined in claim 3 wherein said cross-coupled inverters are transistors having their bases connected to respective ones of said diodes, and wherein the magnitudes of said transient signal and said blocking voltage are such that the latter, while applied to said point, precludes any substantial change in the conductive state of the transistor associated with the diode adjacent said point, which change would be due to said transient altering the base bias of said transistor.

5. In a binary counter for counting a sequence of input pulses from one to ten and having four flip-flops in serial cascade, each of said flip-flops including a pair of regeneratively cross-coupled inverters and a pair of trigger input terminals each coupled through a respective capacitor to a diode connected to a control terminal of a respective inverter, a feed-forward conductive path connected between the first and second flip-flops so that after a change in the state of the fourth flip-flop in response to the eighth pulse, the tenth pulse will again change the state of the fourth flip-flop;

and a feed-back conductive path from the fourth to the second flip-flop for carrying a signal for inhibiting the second flip-flop from changing its state in response to the tenth pulse, said feed-back path being connected between the output of one of the inverters of the fourth flip-flop to a point intermediate an input capacitor and its associated diode in the circuit of said second flip-flop.

6. A binary counter as defined in claim 5 wherein said inverters are transistors, each said control terminal being the base of a respective transistor.

References Cited

UNITED STATES PATENTS 3,311,737 3/1967 Soltz ---------------- 235—92

DARYL W. COOK, *Acting Primary Examiner.*

G. J. MAIER, *Assistant Examiner.*